US008587378B2

(12) United States Patent
Khandavalli

(10) Patent No.: US 8,587,378 B2
(45) Date of Patent: Nov. 19, 2013

(54) ANALOG PRE-DISTORTION LINEARIZER

(76) Inventor: Chandra Khandavalli, Livermore, CA (US)

(*) Notice: Subject to any disclaimer, the term of this patent is extended or adjusted under 35 U.S.C. 154(b) by 59 days.

(21) Appl. No.: 13/417,246

(22) Filed: Mar. 11, 2012

(65) Prior Publication Data

US 2013/0127541 A1    May 23, 2013

Related U.S. Application Data

(60) Provisional application No. 61/629,410, filed on Nov. 18, 2011.

(51) Int. Cl.
*H03F 1/14* (2006.01)
(52) U.S. Cl.
USPC .............................. 330/292; 330/149; 330/109
(58) Field of Classification Search
USPC .......................................... 330/292, 149, 109
See application file for complete search history.

(56) References Cited

U.S. PATENT DOCUMENTS

| 4,317,083 A * | 2/1982 | Boyd ............................. 330/296 |
| 5,038,113 A | 8/1991 | Katz |
| 5,191,338 A | 3/1993 | Katz |
| 5,736,898 A | 4/1998 | Kohl |
| 6,377,118 B1 | 4/2002 | Shigaki |
| 7,288,987 B2 * | 10/2007 | Carichner et al. ............ 330/136 |
| 7,554,397 B2 * | 6/2009 | Vitzilaios et al. ............. 330/149 |
| 8,120,426 B1 * | 2/2012 | Granger-Jones et al. ..... 330/260 |

OTHER PUBLICATIONS

Nakayama, "A novel amplitude and phase linearizing technique for microwave power amplifiers", 1995 IEEE International Microwave Symposium Digest, pp. 1451-1454, Jun. 1995.

* cited by examiner

*Primary Examiner* — Patricia Nguyen
(74) *Attorney, Agent, or Firm* — Shalini Venkatesh

(57) ABSTRACT

An analog pre-distortion linearizer having predetermined gain and phase characteristics as a function of input RF signal power is disclosed. The linearizer comprises a core circuit comprising an input terminal configured to receive an input RF signal; an output terminal configured to provide a processed version of that signal; a transistor having a gate, a drain, and a source; and a feedback circuit, presenting an impedance at the frequency of the RF signal, connected to the transistor. The gate is connected to the input terminal and the drain is connected to the output terminal. First and second dc bias voltages applied to the gate and drain respectively cause the transistor to operate at a quiescent bias point in a saturated region of the transistor I-V plane. The quiescent bias point and the impedance are selected such that the linearizer has the predetermined gain and phase characteristics.

22 Claims, 18 Drawing Sheets

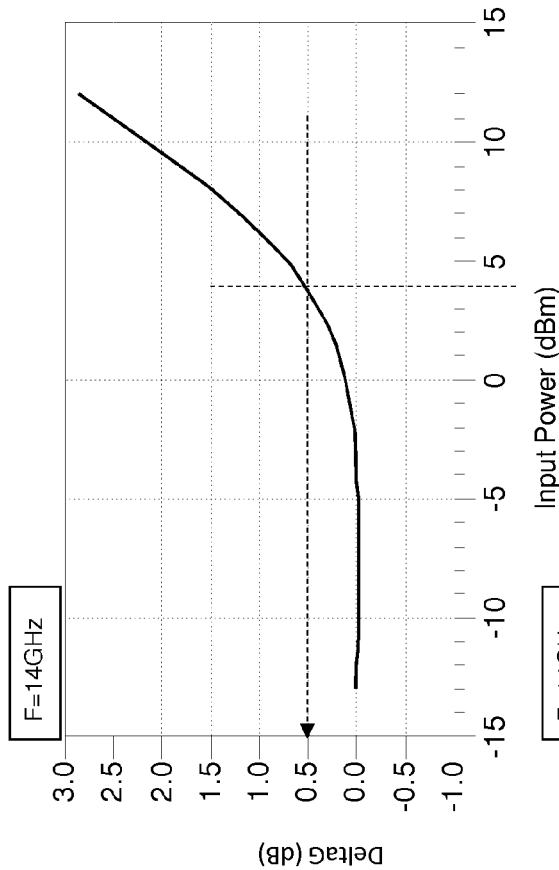
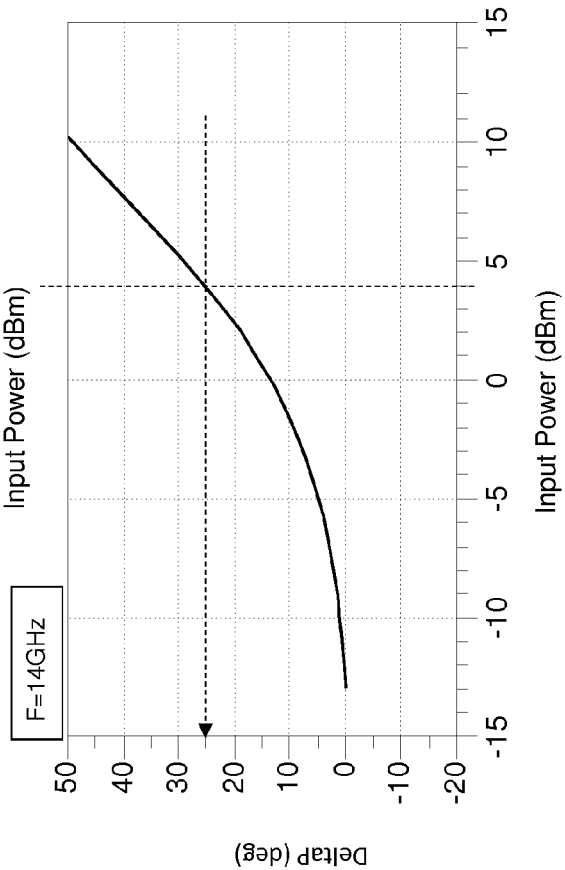
Fig. 8A
Fig. 8B

US 8,587,378 B2

ANALOG PRE-DISTORTION LINEARIZER

RELATED APPLICATION

This application claims the benefit of U.S. Provisional Application No. 61/629,410, filed Nov. 18, 2011.

BACKGROUND

High power amplifiers (HPAs), such as those often used in wireless communication systems, are intrinsically characterized by gain compression and either phase compression or phase expansion, so they impose amplitude and phase distortion on the RF signals being amplified. Although operating in the relatively linear range of an HPA can minimize these distortions, RF output signal power is correspondingly restricted, and the power restriction is accompanied by low HPA operating efficiency.

Pre-distortion linearizers attempt to compensate for HPA imperfections by "linearizing"—actually pre-distorting—an RF input signal before it reaches the HPA, ideally providing gain expansion to compensate for the HPA gain compression, and phase expansion (or compression) to compensate for the HPA phase compression (or expansion). The subsequent HPA distortions imposed on the pre-distorted signal result in relatively flat gain and phase responses from the linearizer/HPA combination. In this way, linearizers allow a much greater fraction of the HPA's operating range to be utilized with acceptably low distortion, and correspondingly improved efficiency.

Some currently available FET-based linearizers use FETs in circuit configurations that are either incompatible or difficult to implement with the majority of commercially available integrated FET chips. Some allow for gain expansion but ignore consideration of phase expansion or compression; in other cases, both gain and phase compensations are adjustable but not independently. Some linearizers split an incoming RF signal into portions that are separately processed through a fixed arrangement of different microwave functional blocks, and then reassembled. Such "processed signal linearizers" are relatively complex, costly, and do not lend themselves to chip level integration.

What is needed is a linearizer, and method of operating such a linearizer, that makes use of well characterized and/or readily available integrated circuit components in a simple configuration, to provide gain expansion and phase compensation (expansion or compression as desired), preferably offering a convenient means of adjusting circuit parameters and operating conditions to independently adjust the gain and phase compensations according to the characteristics of the HPA to which the linearizer output is delivered.

SUMMARY

In some embodiments, there is provided an analog pre-distortion linearizer having predetermined gain and phase characteristics as a function of input RF signal power. The linearizer comprises a core circuit comprising an input terminal configured to receive an input RF signal; an output terminal configured to provide a processed version of that signal; a transistor having a gate, a drain, and a source; and a first feedback circuit, presenting a first impedance at the frequency of the RF signal, connected to the transistor. The gate is connected to the input terminal and the drain is connected to the output terminal. First and second dc bias voltages applied to the gate and drain respectively cause the transistor to operate at a quiescent bias point in a saturated region of the transistor I-V plane. The quiescent bias point and the first impedance are selected such that the linearizer has the predetermined gain and phase characteristics.

In other embodiments, there is provided an analog pre-distortion linearizer having predetermined gain and phase characteristics as a function of input RF signal power. The linearizer comprises a core circuit comprising an input terminal configured to receive an input RF signal; an output terminal configured to provide a processed version of that signal; a transistor having a gate, a drain, and a source, The core circuit further comprises a parallel feedback circuit connected between the gate and the drain, and a series feedback circuit connected between the source of the transistor and ground, the parallel and series feedback circuits presenting first and second impedances respectively at the frequency of the RF signal. The gate is connected to the input terminal and the drain is connected to the output terminal. First and second dc bias voltages applied to the gate and drain respectively cause the transistor to operate at a quiescent bias point in a saturated region of the transistor I-V plane. The quiescent bias point and the first and second impedances are selected such that the linearizer has the predetermined gain and phase characteristics.

In other embodiments, there is provided a method of generating a pre-distorted RF signal to compensate for expected gain and phase distortions characteristic of an amplifier. The method comprises receiving an input RF signal at an input terminal of a core circuit, the core circuit comprising a first feedback circuit connected to a transistor, the transistor having a gate connected to the input terminal, a drain connected to an output terminal, and a source. First and second dc bias voltages are applied to the gate and drain respectively, selecting the first and second dc bias voltages to cause the transistor to operate at a quiescent bias point in a saturated region of the transistor I-V plane. The first feedback circuit is tuned to present a first impedance at the frequency of the input RF signal, selecting the first impedance and the quiescent bias point such that if the pre-distorted RF signal is subsequently amplified by the amplifier to provide an output signal, the output signal is characterized by a lower value of at least one of gain distortion and phase distortion than the corresponding one of the expected gain distortion and phase distortion that would have occurred if the input RF signal had been input directly into the amplifier. The method further comprises providing the pre-distorted RF signal at the output terminal.

Further embodiments are disclosed herein or will become apparent to those skilled in the art after having read and understood the specification and drawings hereof.

BRIEF DESCRIPTION OF THE DRAWINGS

Different aspects of the various embodiments will become apparent from the following specification, drawings and claims in which:

FIGS. 8A and 8B show gain and phase characteristics as a function of input signal power of an embodiment of a core circuit of the type shown in FIG. 3 including the parallel feedback circuit of FIG. 4 presenting capacitive impedance, illustrating the feature of predominantly phase expansion at yet another set of bias conditions.

DETAILED DESCRIPTION OF SOME EMBODIMENTS

All the embodiments described in this disclosure depend on the non-linear characteristics of transistors including, for example, field-effect transistors (FETs), or bipolar transistors, so a brief description of these characteristics will now be presented, along with the definitions of related terms to be used in the remainder of the disclosure.

Figure 1A:
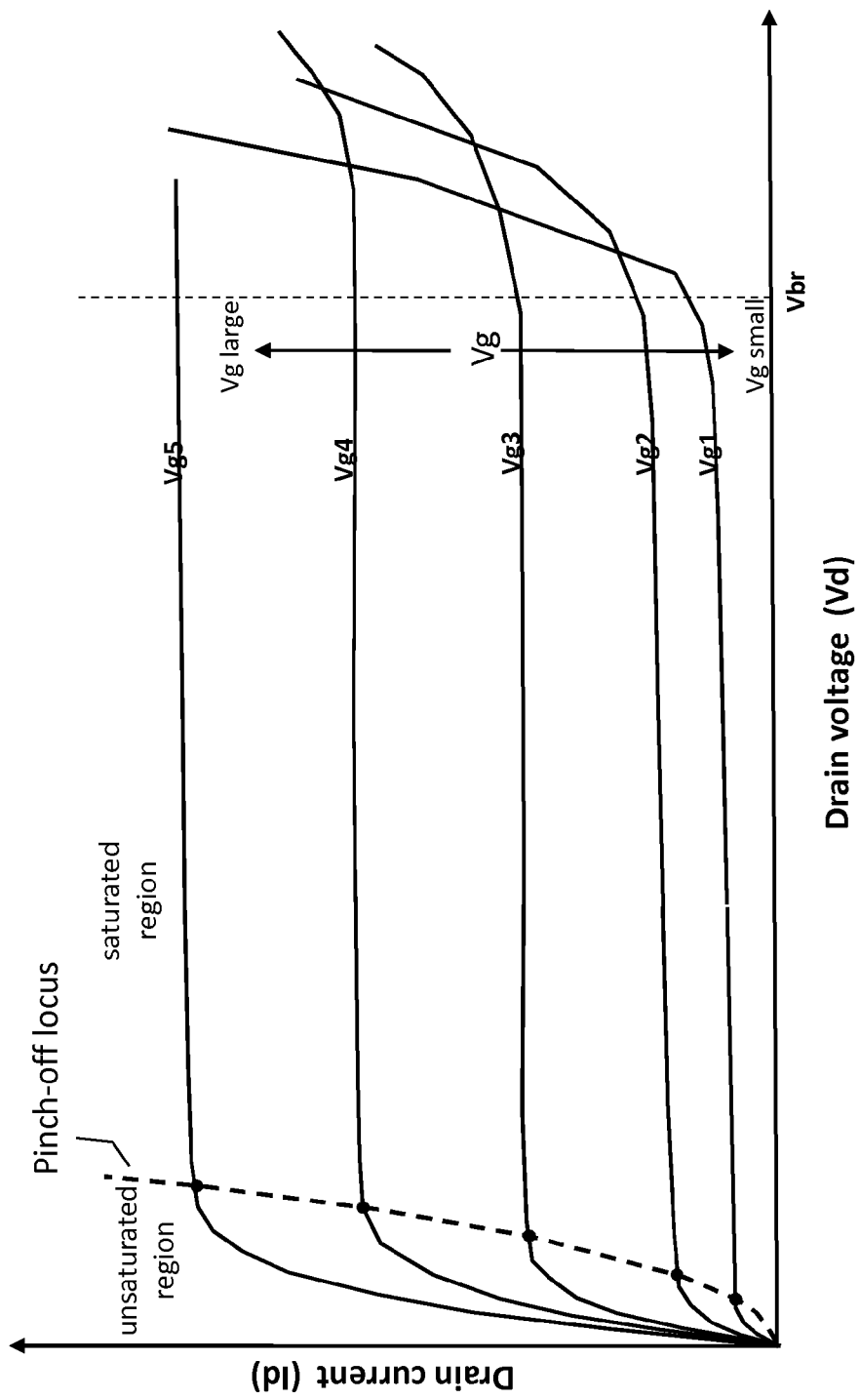
FIGS. 1A and 1B show typical current-voltage characteristic behavior of a transistor in the I-V plane, identifying various regions and terminology used in this application.

FIG. 1A shows a typical set of curves indicating the relationship between drain voltage $V_d$ and drain current $I_d$ of the transistor for various settings of gate voltage $V_g$. These are known as I-V curves, plotted in the I-V plane. $V_{br}$ is defined as the breakdown voltage above which $I_d$ rises sharply due to gate to drain breakdown phenomena. In the region to the left of the trace marked "pinch-off locus", the drain current $I_d$ varies with $V_d$ for a given gate voltage $V_g$. This first region is called the "unsaturated" or "ohmic" region. To the right of the pinch-off locus, but to the left of the vertical line at the breakdown voltage, the drain current $I_d$ remains substantially constant for a given gate voltage $V_g$. This second region is called the "saturated" region. Embodiments described herein use transistors operated at quiescent bias points in the saturated region.

Figure 1B:
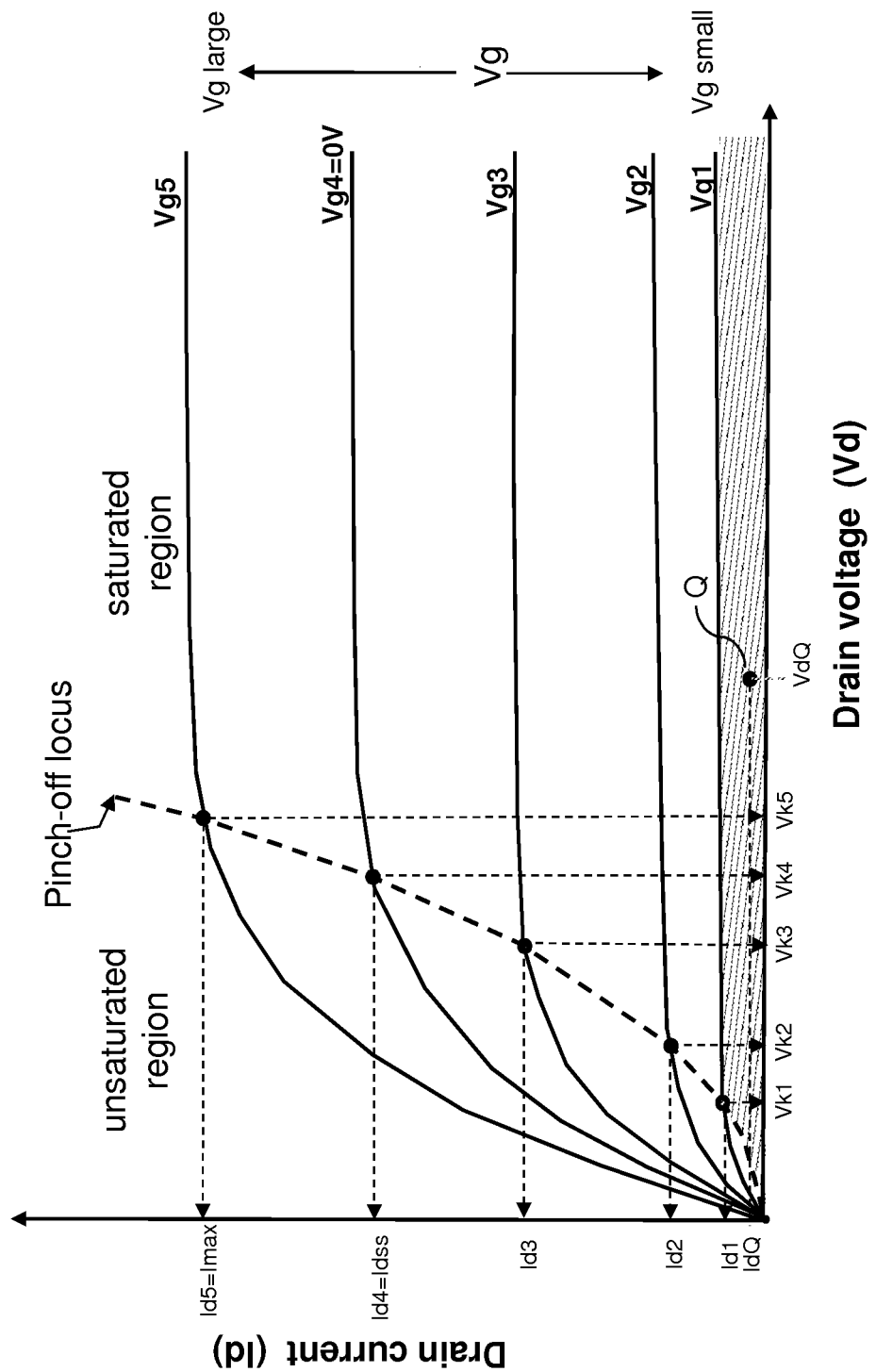

FIG. 1B presents a zoomed-in view of the curves of FIG. 1A, showing details around the pinch-off locus. Saturated drain currents $I_{d1}$, $I_{d2}$, $I_{d3}$, $I_{d4}$, and $I_{d5}$ (=Imax) are shown for corresponding gate voltages of $V_{g1}$, $V_{g2}$, $V_{g3}$, $V_{g4}$ (=0V), and $V_{g5}$ respectively. $V_{k1}$, $V_{k2}$, $V_{k3}$, $V_{k4}$, and $V_{k5}$ are corresponding knee-voltages, which refer to the drain voltages above which drain current saturation occurs. $I_{d5}$ is the maximum current the drain-source channel can support, Imax, which is defined as the drain current that flows when the gate is biased to fully open the source-drain channel, and to free the channel current from being constrained by the influence of the gate voltage.

FIG. 1B shows a typical quiescent bias point Q of the present invention, which is located in the saturated region of the I-V plane. The corresponding drain current $I_{dQ}$ and drain voltage $V_{dQ}$ are also shown. Here, the transistor gate is so biased as to allow very small quiescent drain current, $I_{dQ}$ which is typically nominally set to 0.2% of Imax, but could be set anywhere below 5% of Imax. As an example, for a transistor with Imax of 200 mA, this translates to a quiescent drain current which is nominally at 0.4 mA, but could be set anywhere below 10 mA. As for $V_{dQ}$, it is nominally set to +2.5V, but could be anywhere below $V_{br}$, in the saturated region. The shaded area in FIG. 1B identifies the region for quiescent bias point setting of the transistor of the linearizer for all embodiments discussed below.

Figure 2:
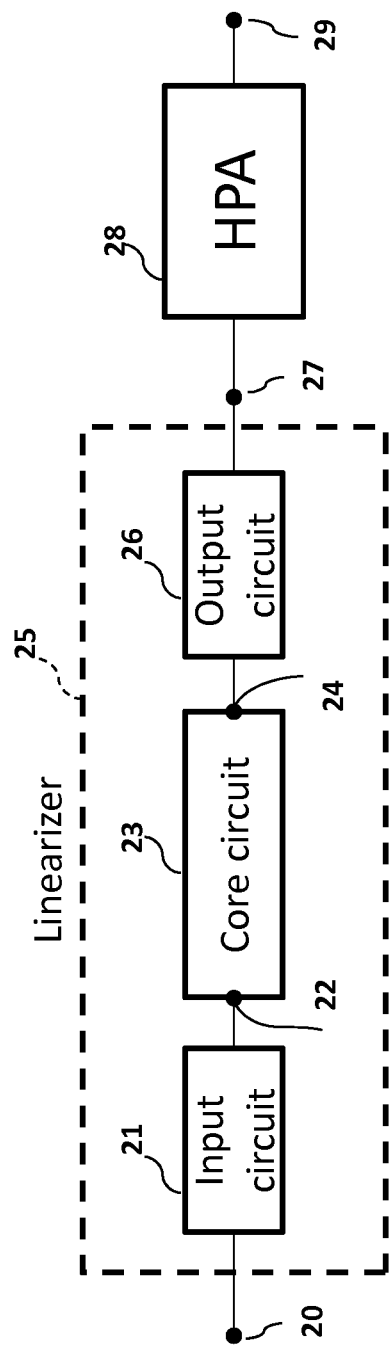
FIG. 2 shows a simplified block diagram of an amplifier system showing one embodiment of a linearizer operably connected to an HPA.

FIG. 2 shows a block diagram of an amplifier system that includes an HPA 28 and one embodiment of a linearizer 25. Linearizer 25 includes an input circuit 21, an output circuit 26 and one embodiment of a core circuit 23 having input terminal 22 and output terminal 24. Input circuit 21 receives the RF signal to be linearized at terminal 20 and provides an impedance-matched and level adjusted version of that RF signal as an input RF signal at input terminal 22 of core circuit 23. Input circuit 21 also provides a first dc bias voltage to core circuit 23 at input terminal 22. Core circuit 23 provides a processed version of the input RF signal at output terminal 24 to an output circuit 26. Output circuit 26 in turn provides an impedance-matched and level adjusted version of the processed RF signal and provides an output at terminal 27 to an HPA 28. Output circuit 26 also provides a second dc bias voltage to core circuit 23 at output terminal 24. The linearized output RF signal produced by the combination of linearizer 25 and HPA 28 is provided at terminal 29. HPA 28 could be, for example, a Traveling-Wave Tube Amplifier (TWTA) or a Solid State Power Amplifier (SSPA).

Figure 3:
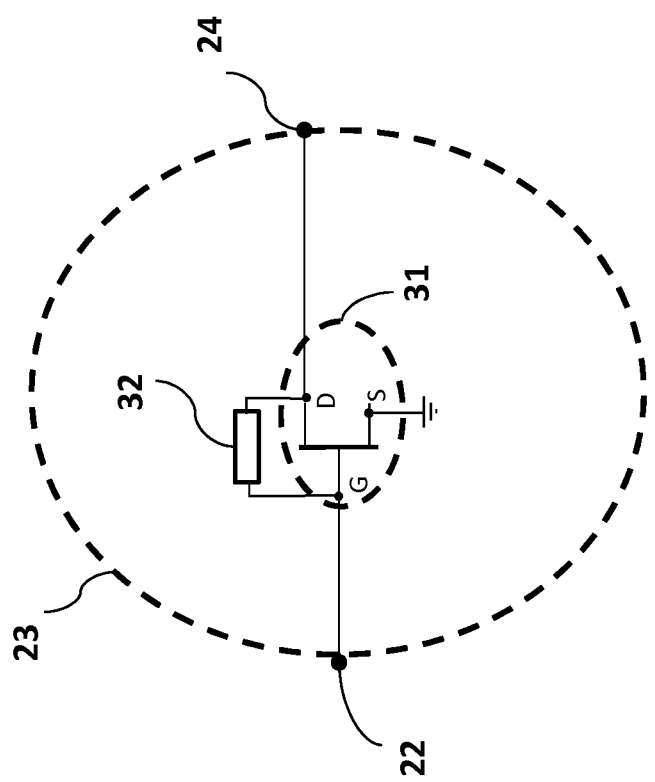
FIG. 3 shows a simplified block diagram of one embodiment of a core circuit of a linearizer.

FIG. 3 shows a block diagram of one embodiment of core circuit 23. This embodiment includes a transistor 31 having gate G, drain D, and source S terminals. The gate G is connected to input terminal 22, the source S is directly connected to ground, and the drain D is connected to output terminal 24. A parallel feedback circuit 32 is connected between the gate and the drain of transistor 31.

One effect of parallel feedback circuit 32 on the RF signal output from core circuit 23 is to provide gain expansion, which may be expressed in terms of a positive DeltaG value, defined as a function of power level as the change in gain relative to its small signal gain value at that power level. Another effect of parallel feedback circuit 32 on the RF signal output from core circuit 23 is to provide phase expansion or phase compression, which may be expressed in terms of a positive or negative DeltaP value respectively, defined as a function of power level as the change in RF signal phase relative to its small signal phase value at that power level.

Figure 4:
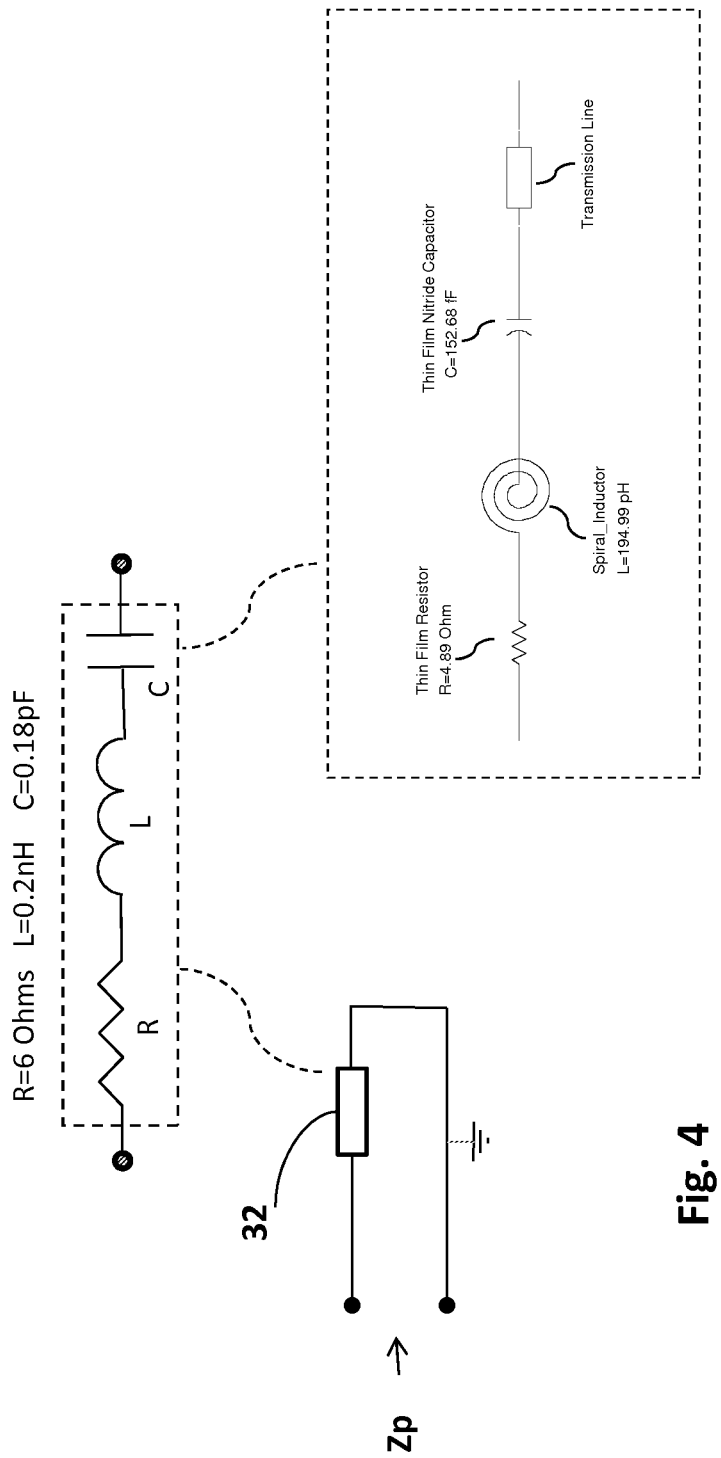
FIG. 4 shows models of a parallel feedback circuit used in one embodiment of a core circuit of a linearizer.

FIG. 4 shows a schematic of parallel circuit 32, modeled as a series of discrete R, L, C elements. Practical realization of parallel circuit 32 may be achieved by means of any one of several techniques known to those skilled in the art, employing discrete elements such as R-L-C, or by employing distributed elements such as transmission lines, stubs or by employing biased active devices such as diodes or transistors.

Parallel feedback circuit 32 may be configured to provide either capacitive or inductive impedance Zp at the RF signal frequency. As one example, ideal model values of R=6 Ohms, L=0.2 nH and C=0.18 pF could be used, as depicted in the upper dashed box in FIG. 4, providing capacitive impedance of value 6.0−j45.6 Ohms at 14 GHz. More realistic modeling may be carried out based, for example, on validated models, supported by measurements, of a thin film resistor, a spiral inductor, a MIM capacitor and a transmission line. For the particular values chosen in the model depicted in the lower dashed box in FIG. 4, a capacitive impedance of 5.4−j45.7 Ohms at 14 GHz would be achieved.

Figure 5A:
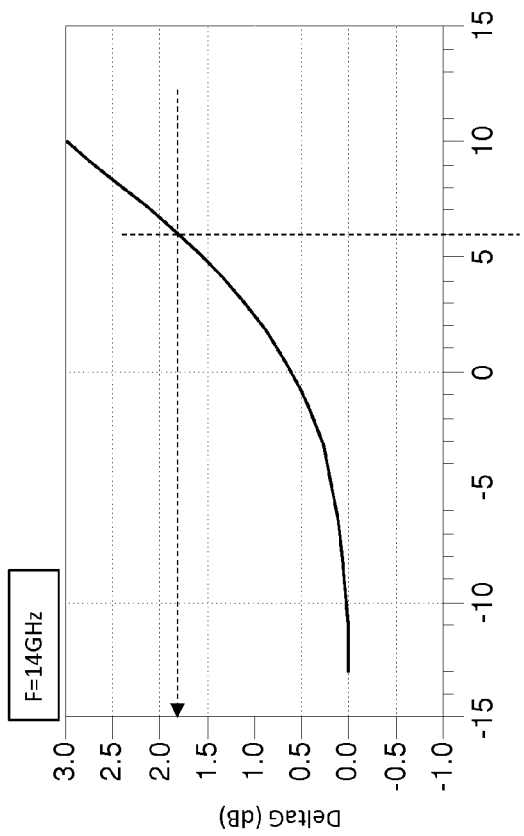
FIGS. 5A and 5B show gain and phase characteristics as a function of input signal power of an embodiment of a core circuit of the type shown in FIG. 3 including the parallel feedback circuit of FIG. 4 presenting capacitive impedance, illustrating the feature of simultaneous gain expansion and phase expansion at one set of bias conditions.
Figure 5B:
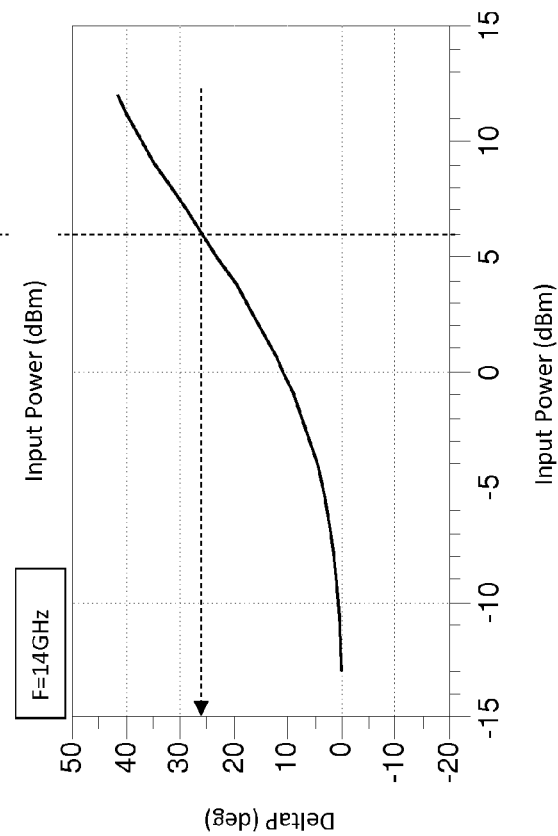

FIGS. 5A and 5B show simulated gain and phase characteristics as a function of input signal power of an embodiment of core circuit 23 including the parallel feedback circuit 32 configured to provide capacitive impedance, and with transistor 31 operated at one particular set of bias conditions. The results shown are simulated for a quiescent point Q where the drain current $I_{dQ}$ is 0.28% of Imax, and the drain voltage $V_{dQ}$ is 2.0V. FIGS. 5A and 5B illustrate that simultaneous gain expansion and phase expansion may be achieved, with magnitudes determined by the input signal power for this particular set of bias conditions. It may be seen that at a nominal input RF signal power of +6 dBm, gain expansion of +1.8 dB and phase expansion of +25 degrees are obtained. Changes to the input signal power result in simultaneous changes to DeltaG and DeltaP values. While these results are simulated using ideal R-L-C element models, very similar results are achieved from simulations using experimentally validated element models.

Figure 6A:
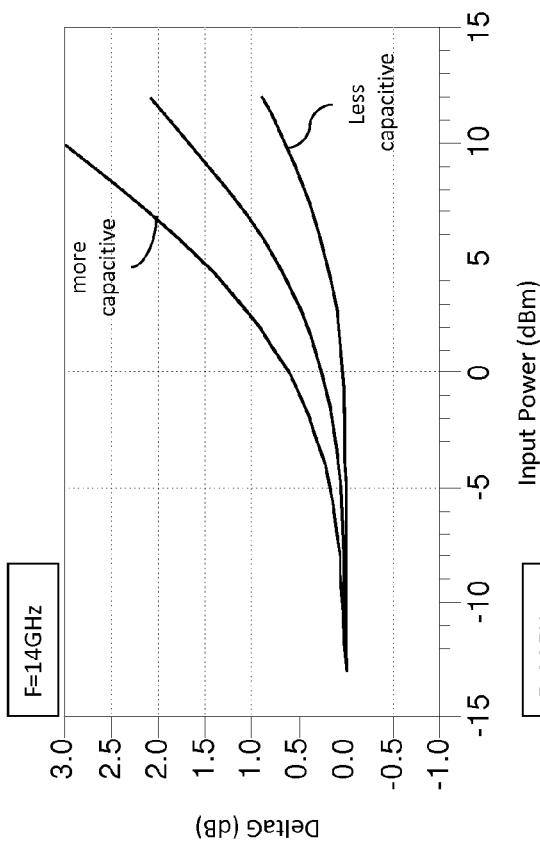
FIGS. 6A and 6B show gain and phase characteristics as a function of input signal power of an embodiment of a core circuit of the type shown in FIG. 3 including the parallel feedback circuit of FIG. 4, illustrating the feature of capacitive tuning.
Figure 6B:
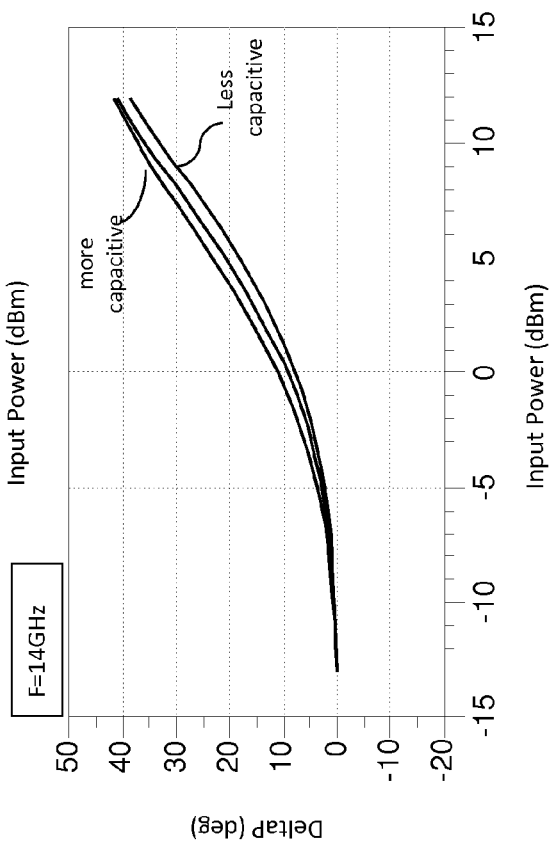

FIGS. 6A and 6B show the effect of adjusting the magnitude of the capacitive impedance of parallel feedback circuit 32 on the gain and phase characteristics of core circuit 23. The magnitudes of the gain expansion and phase expansion provided by this embodiment of linearizer 25 can therefore be adjusted by "tuning" feedback circuit 32, to compensate for the magnitude of the gain compression and any phase compression expected from HPA 28.

Figure 7A:
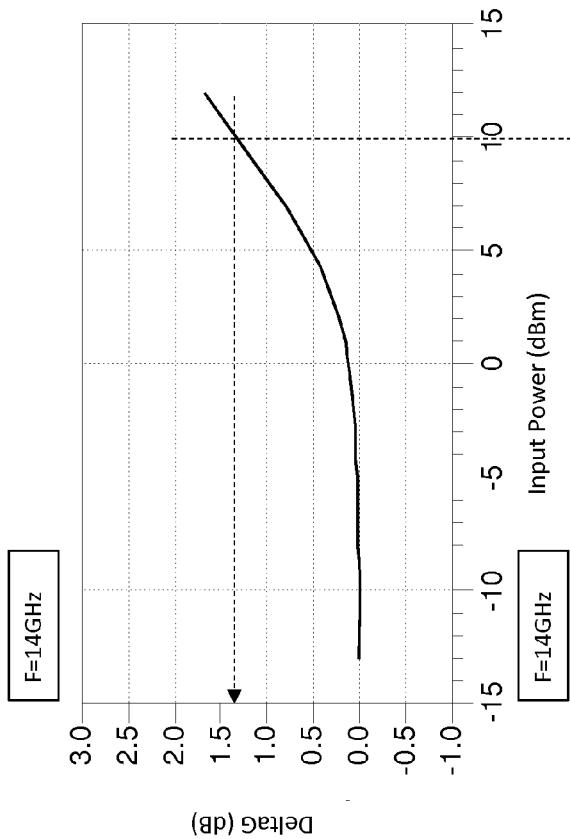
FIGS. 7A and 7B show gain and phase characteristics as a function of input signal power of an embodiment of a core circuit of the type shown in FIG. 3 including the parallel feedback circuit of FIG. 4 presenting capacitive impedance, illustrating the feature of predominantly gain expansion at another set of bias conditions.
Figure 7B:
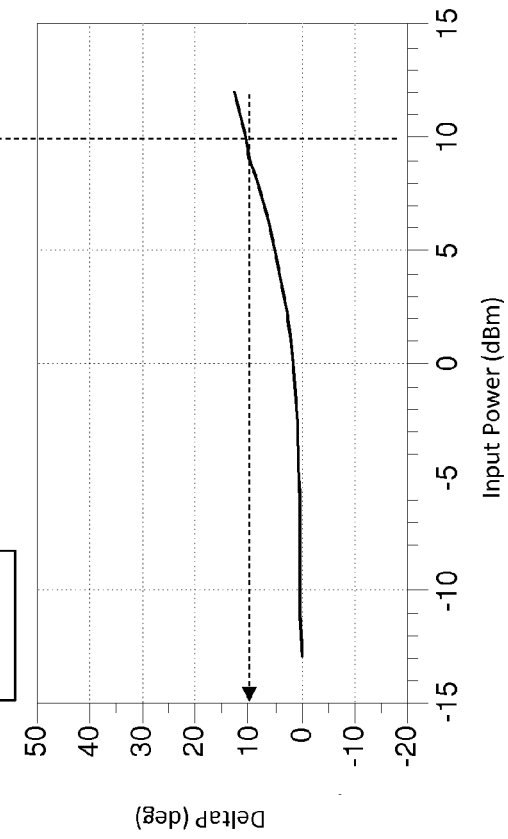

FIGS. 7A and 7B show simulated gain and phase characteristics as a function of input signal power of an embodiment of core circuit 23 including the parallel feedback circuit 32 configured to provide capacitive impedance, and with transistor 31 operated at a significantly different set of bias conditions than those used to generate FIGS. 5A and 5B. The results shown are simulated for a quiescent point Q where the drain current $I_{dQ}$ is 2.0% of Imax, and the drain voltage $V_{dQ}$ is 2.0V. FIGS. 7A and 7B illustrate that at this particular set of bias conditions, gain expansion may be achieved with a magnitude determined by the input signal power as before, but with a relatively small accompanying effect on phase. In other words, the core circuit output exhibits predominantly gain expansion. It may be seen, for example, that at a nominal input RF signal power of +10 dBm, a DeltaG of +1.4 dB is obtained while DeltaP remains at a low figure of 10 degrees. So under such bias conditions, it is possible to tune gain expansion independently of phase expansion by simply adjusting the input RF signal power level. This feature of independent gain adjustability, characteristic of this particular embodiment, may be useful in allowing selective optimization of the gain profile of linearizer 25.

The term "predominantly gain expansion" is used in the context of this disclosure to indicate that a dominant change occurs in DeltaG only, but not in DeltaP. By definition, in the context of this disclosure, a circuit that provides "predominantly gain expansion" provides a DeltaP of magnitude less than 10 degrees while achieving a DeltaG of well over 0.5 dB. Similarly, the terms "predominantly phase expansion" and "predominantly phase compression" indicate that dominant changes occur in DeltaP only but not in DeltaG. Again by definition in the context of this disclosure, a circuit that provides "predominantly phase expansion" or "predominantly phase compression" provides a DeltaG of less than 0.5 dB while achieving a DeltaP of magnitude well over 10 degrees FIGS. 8A and 8B show simulated gain and phase characteristics as a function of input signal power of an embodiment of core circuit 23 including the parallel feedback circuit 32 configured to provide capacitive impedance, and with transistor 31 operated at a significantly different set of bias conditions than either of those used to generate FIGS. 5A and 5B or FIGS. 7A and 7B. In this case, quiescent point Q corresponds to a substantially reduced quiescent drain current $I_{dQ}$ of about 0.02% of Imax and quiescent drain voltage $V_{dQ}$ of 2.0V. Under these conditions, with increased input signal power level, the core circuit output exhibits predominantly phase expansion, with little change in gain. It may be seen, for example, that at a nominal input RF signal power of +4 dBm, a DeltaP of +25 degrees is obtained while DeltaG remains at only +0.5 dB. So under such bias conditions, it is possible to tune phase expansion independently of gain expansion, by simply adjusting the input RF signal power level. This feature of independent phase adjustability, characteristic of this particular embodiment, may be useful in allowing selective optimization of the phase profile of linearizer 25.

Returning to an embodiment of core circuit 23 shown in FIG. 3, as noted above, parallel feedback circuit 32 connected between the gate and the drain of transistor 31 may be configured to present an inductive impedance Zp at the RF signal frequency. Simulations of circuit 32 providing an inductive impedance may be performed with the aid of ideal or experimentally validated R, L, C models in the same way as discussed above with respect to capacitive embodiments. As one example, values of R=3 Ohms, L=0.73 nH and C=0.32 pF may be used in series to provide an inductive impedance of value 3.0+j28.9 Ohms at 14 GHz. As discussed above, techniques for achieving desired impedance values with discrete or distributed elements are well known.

Figure 9A:
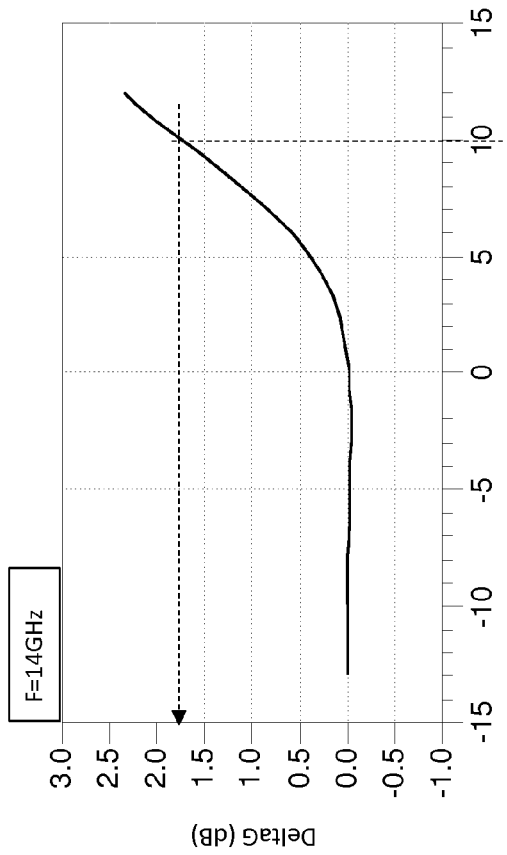
FIGS. 9A and 9B show gain and phase characteristics as a function of input signal power of an embodiment of a core circuit of the type shown in FIG. 3 including the parallel feedback circuit of FIG. 4 presenting inductive impedance, illustrating the feature of simultaneous gain expansion and phase compression at one set of bias conditions.
Figure 9B:
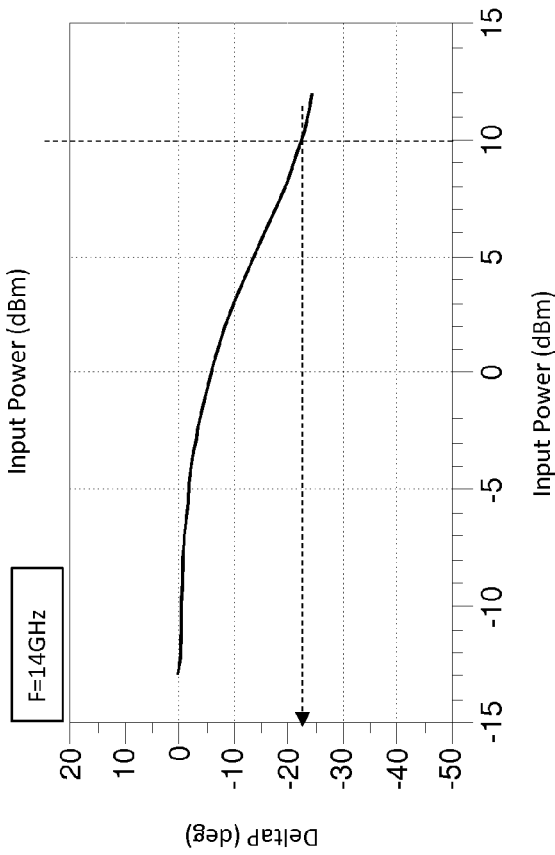

FIGS. 9A and 9B show simulated gain and phase characteristics as a function of input signal power of an embodiment of core circuit 23 including the parallel feedback circuit 32 configured to provide inductive impedance, and with transistor 31 operated a quiescent drain current $I_{dQ}$ of 0.24% Imax and quiescent drain voltage $V_{dQ}$ of 2.2V. It may be seen that at a nominal input drive of +10 dBm, gain expansion of +1.7 dB and phase compression of −23 degrees are obtained. Changes to the input signal power result in simultaneous changes to DeltaG and DeltaP values.

Figure 10A:
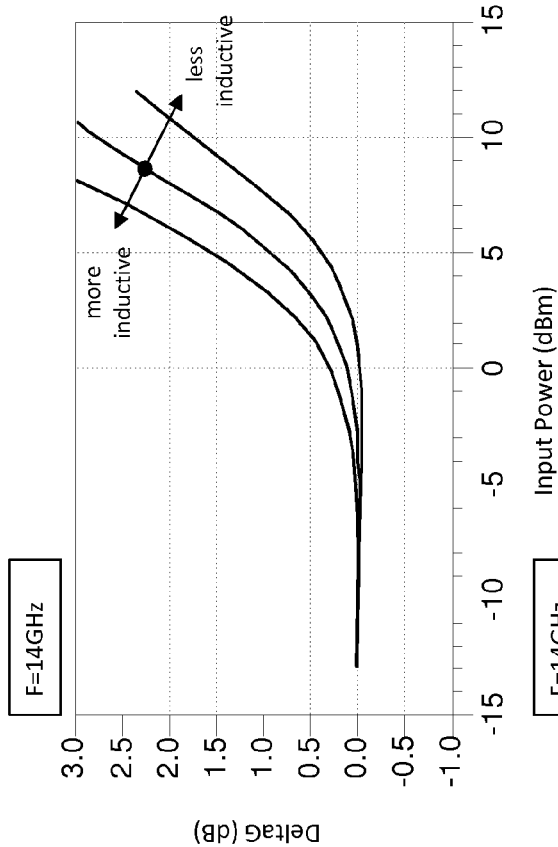
FIGS. 10A and 10B show gain and phase characteristics as a function of input signal power of an embodiment of a core circuit of the type shown in FIG. 3 including the parallel feedback circuit of FIG. 4, illustrating the feature of inductive tuning.
Figure 10B:
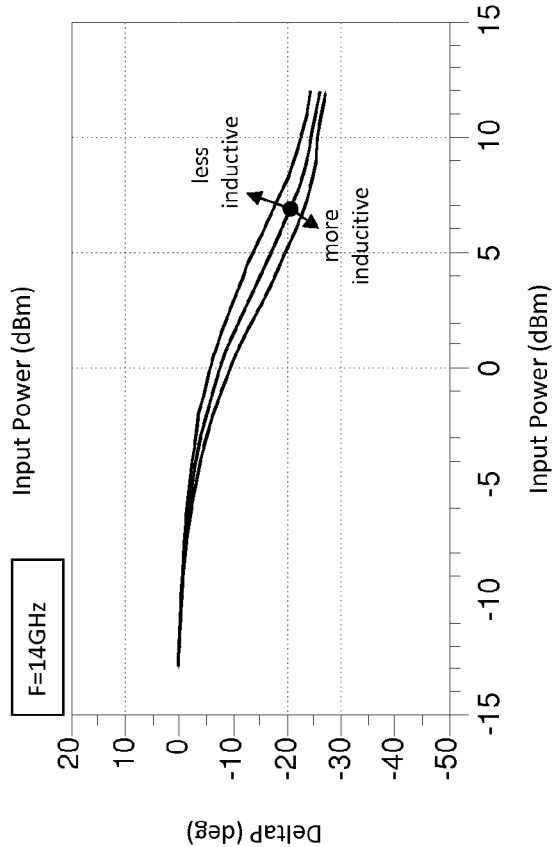

FIGS. 10A and 10B show the effect of adjusting the magnitude of the inductive impedance of parallel feedback circuit 32 on the gain and phase characteristics of core circuit 23. The magnitudes of the gain expansion and phase compression provided by this embodiment of linearizer 25 can therefore be adjusted by "tuning" feedback circuit 32, ideally compensating for the magnitude of the gain compression and any phase expansion expected from HPA 28.

Figure 11A:
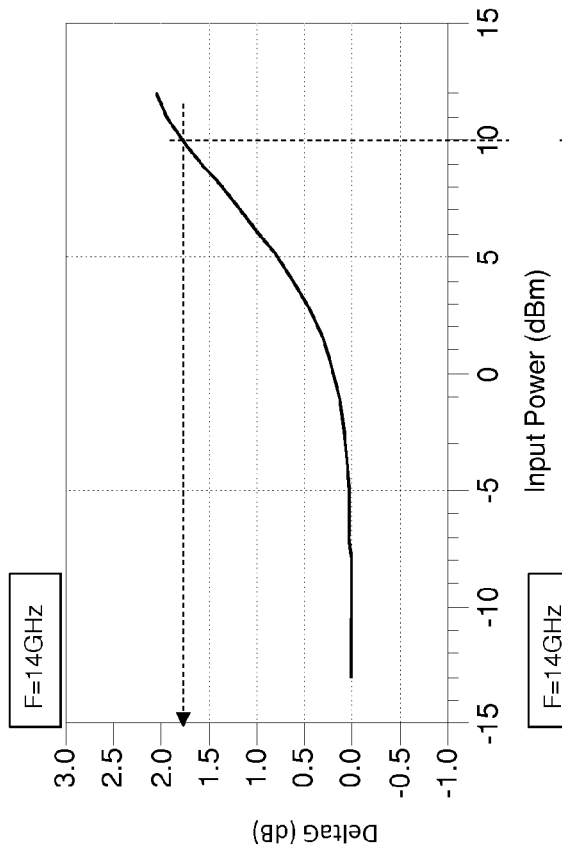
FIGS. 11A and 11B show gain and phase characteristics as a function of input signal power of an embodiment of a core circuit of the type shown in FIG. 3 including the parallel feedback circuit of FIG. 4 presenting inductive impedance, illustrating the feature of predominantly gain expansion at another set of bias conditions.
Figure 11B:
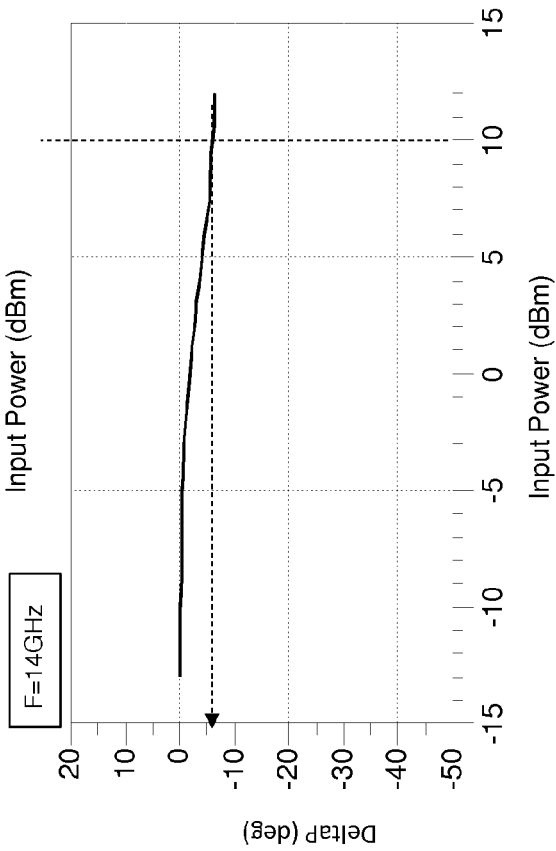

FIGS. 11A and 11B show simulated gain and phase characteristics as a function of input signal power of an embodiment of core circuit 23 including the parallel feedback circuit 32 configured to provide inductive impedance, and with transistor 31 operated at a significantly different set of bias conditions than those used to generate FIGS. 9A and 9B. The results shown are simulated for a quiescent point Q where the drain current $I_{dQ}$ is 1.5% of Imax, and the drain voltage $V_{dQ}$ is 2.2V. FIGS. 11A and 11B illustrate that at this particular set of bias conditions, gain expansion may be achieved with a magnitude determined by the input signal power as before, but with a relatively small accompanying effect on phase. In other words, the core circuit output exhibits predominantly gain expansion. It may be seen, for example, that at a nominal input RF signal power of +10 dBm, a DeltaG of +1.7 dB is obtained while DeltaP remains at a relatively low figure of −6 degrees. So under such bias conditions, it is possible to tune gain expansion independently of phase compression by simply adjusting the input RF signal power level. This feature of independent gain adjustability, characteristic of this particular embodiment, may be useful in allowing selective optimization of the gain profile of linearizer 25

Figure 12A:
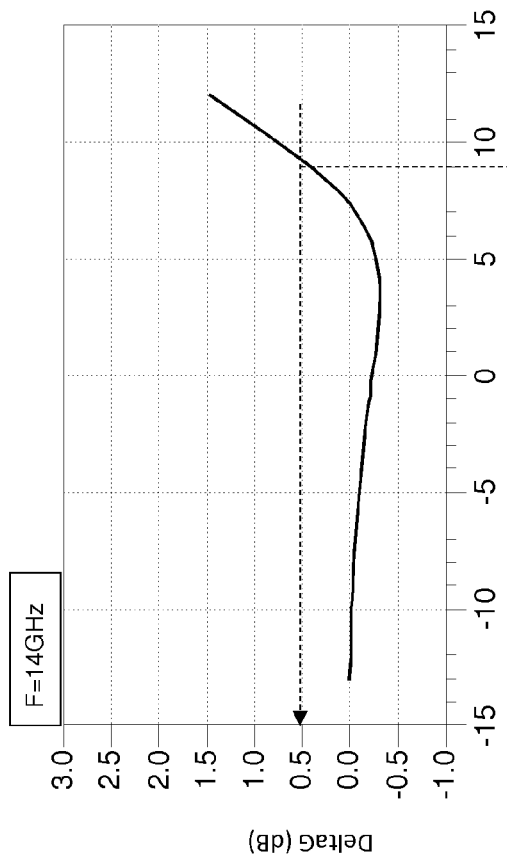
FIGS. 12A and 12B show gain and phase characteristics as a function of input signal power of an embodiment of a core circuit of the type shown in FIG. 3 including the parallel feedback circuit of FIG. 4 presenting inductive impedance, illustrating the feature of predominantly phase compression at yet another set of bias conditions.
Figure 12B:
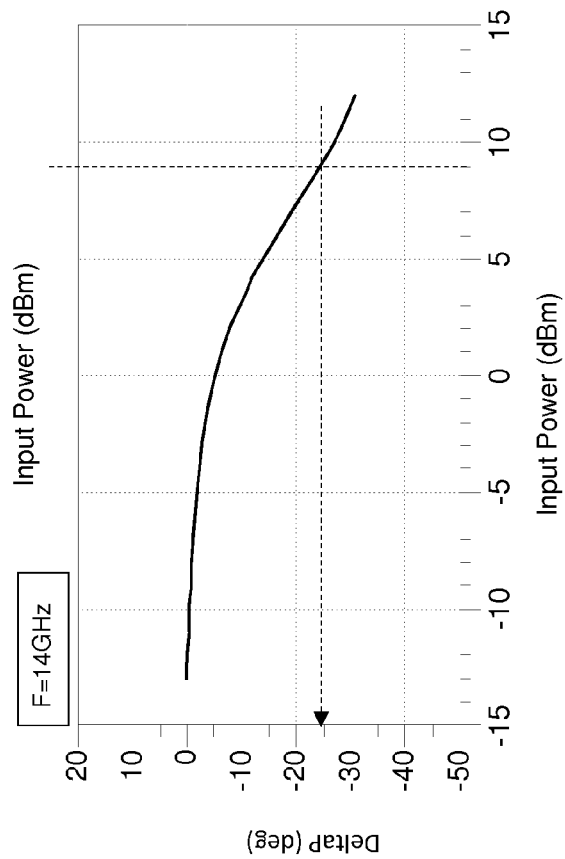

FIGS. 12A and 12B show simulated gain and phase characteristics as a function of input signal power of an embodiment of core circuit 23 including the parallel feedback circuit 32 configured to provide inductive impedance, and with transistor 31 operated at a significantly different set of bias conditions than either of those used to generate FIGS. 9A and 9B or FIGS. 11A and 11B. In this case, quiescent point Q corresponds to a substantially reduced quiescent drain current $I_{dQ}$ of about 0.03% of Imax and quiescent drain voltage $V_{dQ}$ of 2.2V. Under these conditions, with increased input signal power level, the core circuit output exhibits predominantly phase compression, with little change in gain. It may be seen, for example, that at a nominal input RF signal power of +9 dBm, a DeltaP of −25 degrees is obtained while DeltaG remains at only +0.5 dB. So under such bias conditions, it is possible to tune phase compression independently of gain expansion, by simply adjusting the input RF signal power level. This feature of independent phase adjustability, characteristic of this particular embodiment, may be useful in allowing selective optimization of the phase profile of linearizer 25.

Figure 13:
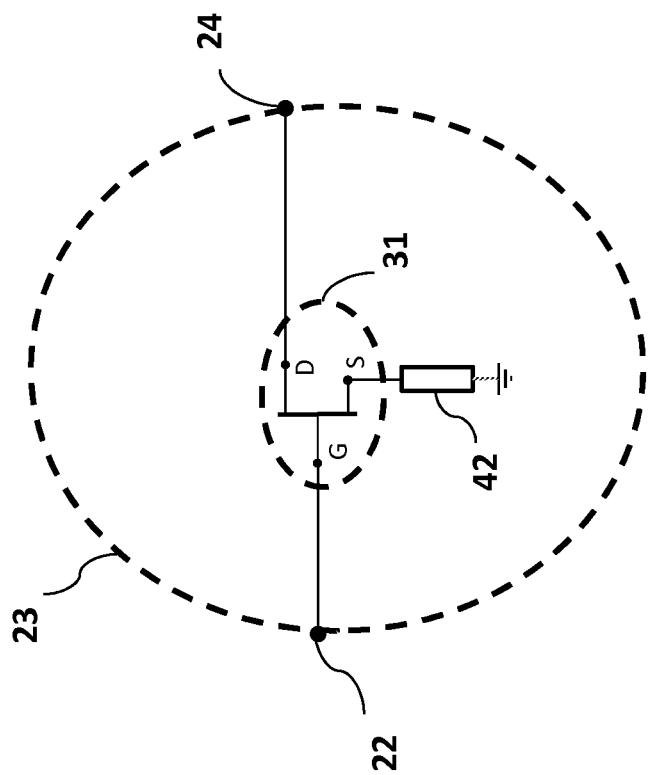
FIG. 13 shows a simplified block diagram of another embodiment of a core circuit of a linearizer.

FIG. 13 shows a block diagram of another embodiment of core circuit 23. This embodiment includes a transistor) 31 having gate G, drain D and source S terminals. The gate is connected input terminal 22, the source is connected to ground via a series feedback circuit 42, and the drain D is connected to output terminal 24.

Series feedback circuit 42 can have similar effects on the RF signal output from core circuit 23 as those discussed in detail above with respect to parallel feedback circuit 32, in providing gain expansion, which may be expressed in terms of a positive DeltaG value, as defined above, and in providing phase expansion or phase compression, which may be expressed in terms of a positive or negative DeltaP value respectively, also as defined above.

Figure 14:
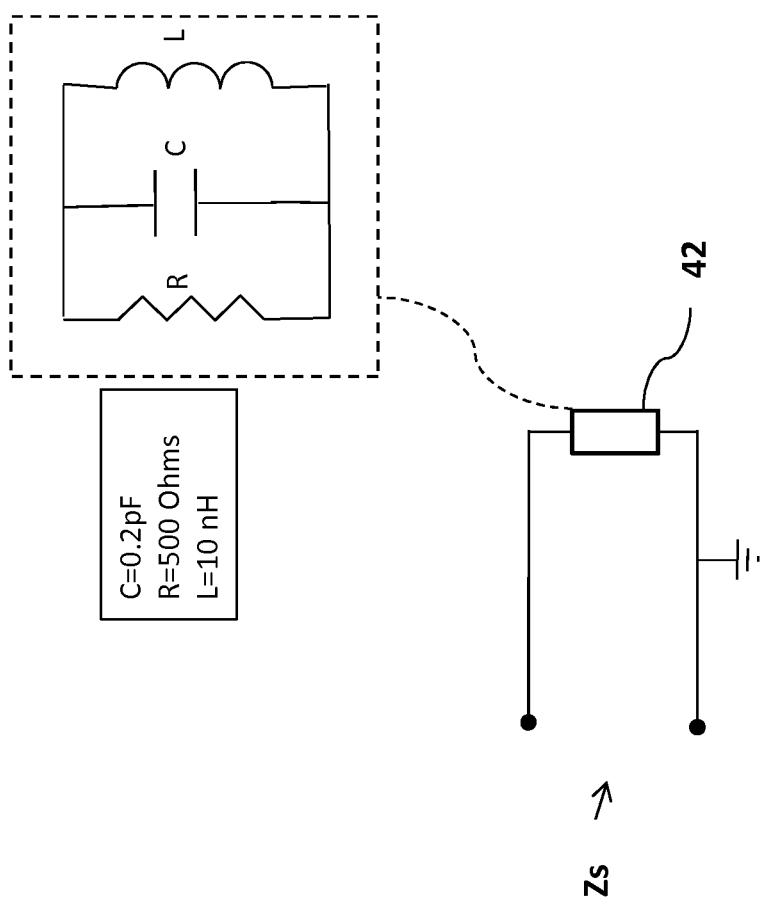
FIG. 14 shows models of a series feedback circuit used in one embodiment of a core circuit of a linearizer.

FIG. 14 shows a schematic of series feedback circuit 42, modeled as a series of discrete R, L, C elements. Practical realization of series circuit 42 may be achieved by means of any one of several techniques known to those skilled in the art, employing discrete elements such as R-L-C, or by employing distributed elements such as transmission lines, stubs or by employing biased active devices such as diodes or transistors.

Series feedback circuit 42 may be configured to provide either capacitive or inductive impedance Zs at the RF signal frequency. Modeling may be carried out in the same ways discussed above with respect to parallel feedback circuit 32, using ideal or experimentally validated circuit element models. As one example, shown in FIG. 14, ideal model values of R=500 Ohms, L=10 nH and C=0.2 pF could be used, providing capacitive impedance of value 7.3−j59.9 Ohms at 14 GHz.

Simulations may be carried out for the performance of embodiments of core circuit 23 including series feedback circuit 42 as shown in FIG. 13 in the same way as the simulations discussed above with respect to embodiments of core circuit 23 including parallel feedback circuit 32, providing corresponding sets of gain and phase characteristics as a function of input signal power for different series feedback impedance values and different quiescent point bias conditions for transistor 31.

As one example, for the particular capacitive impedance values shown in FIG. 14, and at a quiescent point Q where the drain current $I_{dQ}$ is 1.5% of Imax, and the quiescent drain voltage $V_{dQ}$ is 3.4V, the results of the simulation (not shown graphically herein) reveal that at a nominal input signal power of +10 dBm, gain expansion of +2.3 dB and phase expansion of +26 degrees are obtained. Changes to the input signal power result in simultaneous changes to DeltaG and DeltaP values.

Figure 15A:
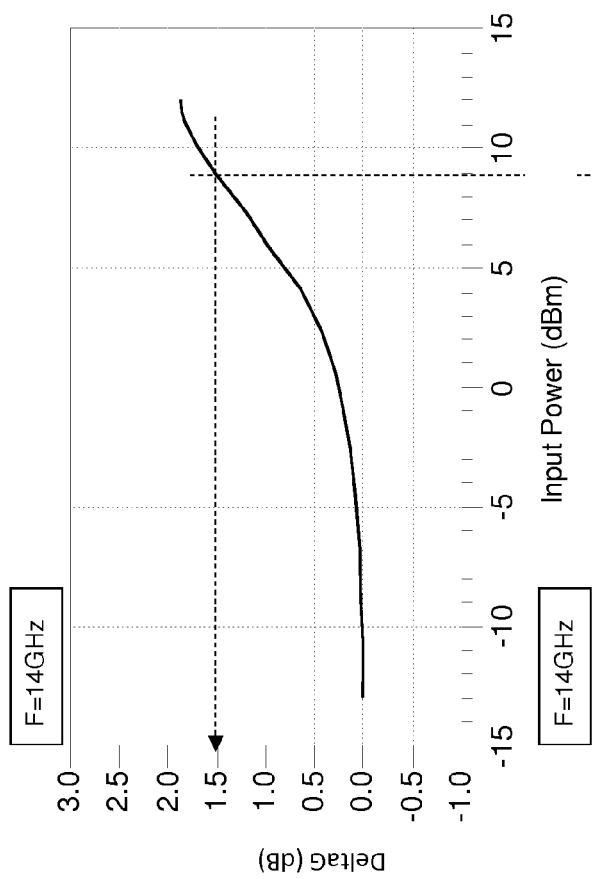
FIGS. 15A and 15B show gain and phase characteristics as a function of input signal power of an embodiment of a core circuit of the type shown in FIG. 13 including the series feedback circuit of FIG. 14 presenting capacitive impedance, illustrating the feature of predominantly gain expansion at one set of bias conditions
Figure 15B:
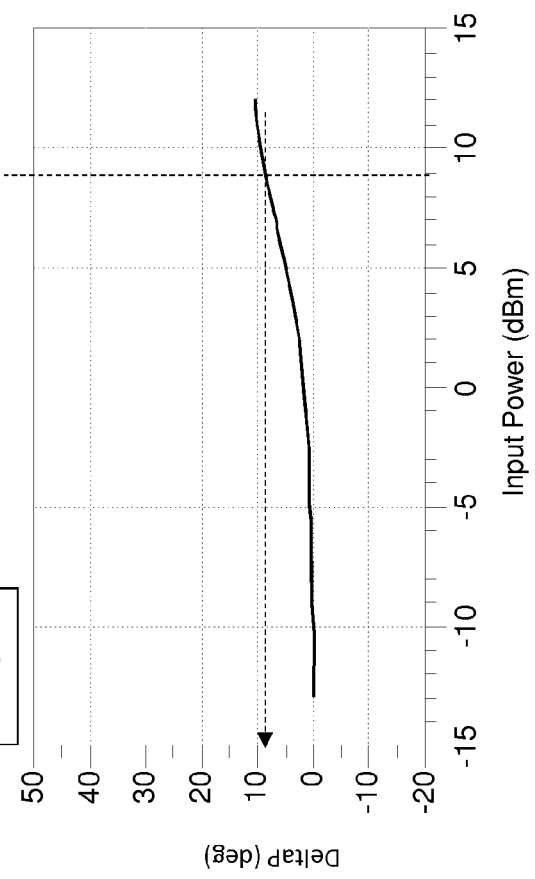

FIGS. 15A and 15B show simulated results for an embodiment of core circuit 23 with series feedback circuit 42 including a different set of element values and a different set of the quiescent point bias conditions (drain current $I_{dQ}$ is 3.5% of Imax, drain voltage $V_{dQ}$ is 3.4V) such that, with increased input RF signal power level, the device output exhibits predominantly gain expansion, with little change in its phase. For example, at an input RF signal power level of +10 dB, a DeltaG of +1.5 dB may be achieved while DeltaP remains at a relatively low value of +9 degrees. So it is possible to tune DeltaG independently of DeltaP, by simply adjusting the input RF signal power level. The feature of independent gain adjustability, characteristic of this particular embodiment, may be useful in allowing selective optimization of the gain profile of linearizer 25.

Returning to an embodiment of core circuit 23 shown in FIG. 13, as noted above, series feedback circuit 42 connected between the source of transistor 31 and ground may be configured to present an inductive impedance Zs at the RF signal frequency.

The same considerations of circuit element modeling, practical realizations, and simulations of core circuit behavior discussed above with embodiments of series feedback circuit 42 which present capacitive impedance apply to embodiments in which series feedback circuit 42 provides inductive impedance. Simulated results of such series embodiments provide corresponding sets of gain and phase characteristics as a function of input signal power for different series feedback impedance values and different quiescent point bias conditions for transistor 31.

As one example, for the particular set of inductive impedance values where L=0.54 nH, R=500 Ohms and C is effectively zero, and at a quiescent point Q where the drain current $I_{dQ}$ is 0.1% of Imax, and the quiescent drain voltage $V_{dQ}$ is 1.9V the results of the simulation (not shown graphically herein) reveal that at a nominal input RF signal power of +5 dBm, gain expansion of +1.6 dB and phase compression of −24 degrees are obtained. Changes to the input signal power result in simultaneous changes to DeltaG and DeltaP values.

In a similar way to that illustrated in FIGS. 10A and 10B, the magnitude of the inductive reactance of series feedback circuit 42 may be "tuned" to adjust the gain and phase characteristics of core circuit 23.

In a similar way to that discussed above with respect to other embodiments, quiescent point bias conditions for transistor 31 may be adjusted to allow the adjustment of the core circuit gain profile independently of the phase profile. For example, if the drain current $I_{dQ}$ is set to be 0.5% of Imax, at a quiescent drain voltage $V_{dQ}$ is 1.9V, the results of the simulation (not shown graphically herein) reveal that at a nominal input drive of +10 dBm, gain expansion of +1.4 dB is achieved while the phase compression remains at a relatively low value of −2 degrees. So it is possible to tune DeltaG independently of DeltaP, by simply adjusting the input RF signal power level. The feature of independent gain adjustability, characteristic of this particular embodiment, may be useful in allowing selective optimization of the gain profile of linearizer 25.

Figure 16:
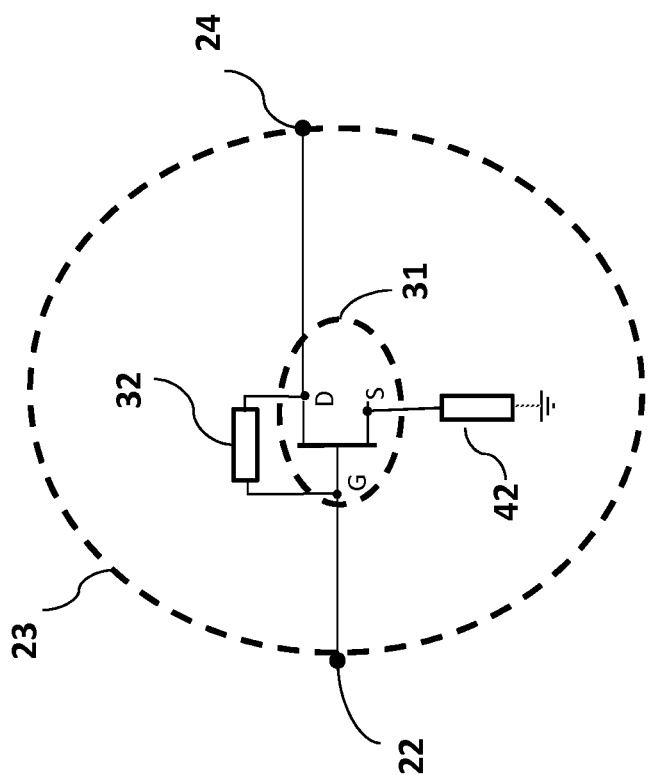
FIG. 16 shows a simplified block diagram of another embodiment of a core circuit of a linearizer.

FIG. 16 shows a block diagram of another embodiment of core circuit 23. This embodiment includes a transistor 31 having gate G, drain D and source S terminals. The gate is connected input terminal 22, the source is connected to ground via a series feedback circuit 42, and the drain D is connected to output terminal 24. A parallel feedback circuit 32 is connected between the gate and the drain of transistor 31. As in previously discussed embodiments, input terminal 22 provides an input RF signal and a first bias voltage to gate G, output terminal provides a second bias voltage to drain D, and receives a processed version of the input RF signal from core circuit 23.

Parallel feedback circuit 32 may be configured to present either a capacitive or an inductive impedance at the RF signal frequency, as previously discussed, and series feedback circuit 42 may be configured independently to present either a capacitive or an inductive impedance at the RF signal frequency. The four different permutations offer additional degrees of freedom to the core circuit operation over those previously discussed, and greatly facilitate ways to generate a variety of gain and phase profile sets for linearizer 25.

In embodiments where parallel feedback circuit 32 is configured to present a capacitive impedance, simulations show that gain expansion and phase expansion characteristics are produced, but the magnitudes and inter-relatedness of those characteristics vary according to whether series feedback circuit 42 is capacitive or inductive, and according to the quiescent point bias conditions set for transistor 31.

For example, in the case where parallel feedback circuit 32 has a capacitive impedance of 44.0−j45.5 Ohms, where series feedback circuit 42 has a capacitive feedback of 1.28−j4.18 Ohms at 14 GHz, where quiescent bias drain current $I_{dQ}$ is set to 0.5% of Imax and drain voltage $V_{dQ}$ is set to 2.8V, it is found that at a nominal input RF signal power of +5 dBm, gain expansion of +2.0 dB and phase expansion of +24 degrees are obtained. Changes to the input signal power result in simultaneous changes to DeltaG and DeltaP values.

In another example of the case where parallel feedback circuit 32 has a capacitive impedance of 44.0−j45.5 Ohms, and series feedback circuit 42 has a capacitive feedback of 1.28−j4.18 Ohms at 14 GHz, but different bias conditions, where $I_{dQ}$ is set to 0.19% of Imax and $V_{dQ}$ to 2.8V, it is found that at a nominal input RF signal power of +3 dBm, a phase expansion of +30 degrees is achieved while the gain expansion remains at only +0.3 dB. Under such bias conditions, it is possible to tune DeltaP quite independently of DeltaG, by simply adjusting the input RF signal power level. This feature of independent phase adjustability may be useful in allowing selective optimization of the phase profile of linearizer 25.

In cases where parallel feedback circuit 32 has a capacitive impedance and series feedback circuit 42 has an inductive impedance, changes in the quiescent point bias conditions may be shown to change gain and phase profile behavior from embodiments where changes to the input signal power result in simultaneous changes to DeltaG and DeltaP values to embodiments where DeltaG may be adjusted quite independently of DeltaP or to embodiments where DeltaP may be adjusted quite independently of DeltaG, In a specific example, in the case where parallel feedback circuit 32 has a capacitive impedance of 46.0−j45.5 Ohms at 14 GHz, and where series feedback circuit 42 has a inductive impedance of 1.28−j4.18 Ohms, where quiescent bias drain current $I_{dQ}$ is set to 0.28% of Imax and drain voltage $V_{dQ}$ is set to 1.8V, it is found that at a nominal input RF signal power of +4 dBm, gain expansion of +2.6 dB and phase expansion of +25 degrees are obtained. However, increasing quiescent bias drain current $I_{dQ}$ to 1.5% of Imax and keeping the drain voltage $V_{dQ}$ at 1.8V allows a gain expansion of +1.6 dB to be achieved at a nominal input RF signal power of 9.5 dBm, with a phase expansion of only 10 degrees. Moreover, reducing quiescent current $I_{dQ}$ to 0.05% of Imax leaving the drain voltage $V_{dQ}$ unchanged at 1.8V allows a phase expansion of +27 degrees to be achieved at a nominal input RF signal power of 0.0 dBm, with a gain expansion of only +0.5 dB.

In embodiments where parallel feedback circuit 32 is configured to present an inductive impedance, simulations show that gain expansion and phase compression characteristics are produced, but the magnitudes and inter-relatedness of those characteristics vary according to whether series feedback circuit 42 is capacitive or inductive, and according to the quiescent point bias conditions set for transistor 31.

For example, in the case where parallel feedback circuit 32 has an inductive impedance of 5.0+j30.7 Ohms at 14 GHz, where series feedback circuit 42 has a capacitive impedance of 1.90−j4.99 Ohms at that frequency, where quiescent bias drain current $I_{dQ}$ is set to 0.24% of Imax and drain voltage $V_{dQ}$ is set to 2.2V, it is found that at a nominal input RF signal power of +10 dBm, gain expansion of +2.2 dB and phase compression of −22 degrees are obtained. Changes to the input signal power result in simultaneous changes to DeltaG and DeltaP values. However, increasing quiescent bias drain current $I_{dQ}$ to 1.0% of Imax and keeping the drain voltage $V_{dQ}$ at 2.2V allows a gain expansion of +2.2 dB to be achieved at a nominal input RF signal power of 10 dBm, with a phase compression of only −6 degrees. Moreover, reducing quiescent current $I_{dQ}$ to 0.016% of Imax and leaving the drain voltage $V_{dQ}$ unchanged at 2.2V allows a phase compression of −25 degrees to be achieved at a nominal input RF signal power of 9 dBm, with a gain expansion of only +0.5 dB.

Similarly, in cases where parallel feedback circuit 32 has an inductive impedance and series feedback circuit 42 has an inductive impedance, changes in the quiescent point bias conditions may be shown to change gain and phase profile behavior from embodiments where changes to the input signal power result in simultaneous changes to DeltaG and DeltaP values to embodiments where DeltaG may be adjusted quite independently of DeltaP or to embodiments where DeltaP may be adjusted quite independently of DeltaG.

In a specific example, in the case where parallel feedback circuit 32 has an inductive impedance of 10.0+j35.99 Ohms at 14 GHz, and where series feedback circuit 42 has an inductive impedance of 6.54+j7.44 Ohms, where quiescent bias drain current $I_{dQ}$ is set to 0.5% of Imax and drain voltage $V_{dQ}$ is set to 3.4V, it is found that at a nominal input RF signal power of +10 dBm, gain expansion of +2.2 dB and phase compression of −25 degrees are obtained. However, increasing quiescent bias drain current $I_{dQ}$ to 1.5% and keeping the drain voltage $V_{dQ}$ at 3.4V allows a gain expansion of +2.1 dB to be achieved at a nominal input RF signal power of 10 dBm, with a phase compression of only −7 degrees. Moreover, reducing quiescent current $I_{dQ}$ to 0.38% of Imax and leaving the drain voltage $V_{dQ}$ unchanged at 3.4V allows a phase compression of −25 degrees to be achieved at a nominal input RF signal power of 6.5 dBm, with a gain expansion of only +0.5 dB.

Changes to the quiescent bias point conditions thus offer particularly extensive adjustment capabilities to embodiments of core circuit 23 that include both parallel feedback circuit 32 and series feedback circuit 42. It should also be noted that the magnitudes of the gain expansion and phase expansion or compression provided by such embodiments can be adjusted by "tuning" the elements of series feedback circuit 42, to adjust the magnitude of its effective impedance value as desired. Methods of achieving such tuning are well known.

Also well known in the art are methods of configuring input circuit 21 and output circuit 26 to provide impedance matching and signal level adjustment functions as required for the RF signals of interest, and to provide the required bias voltages to the input and output terminals of core circuit 23.

Figure 17:
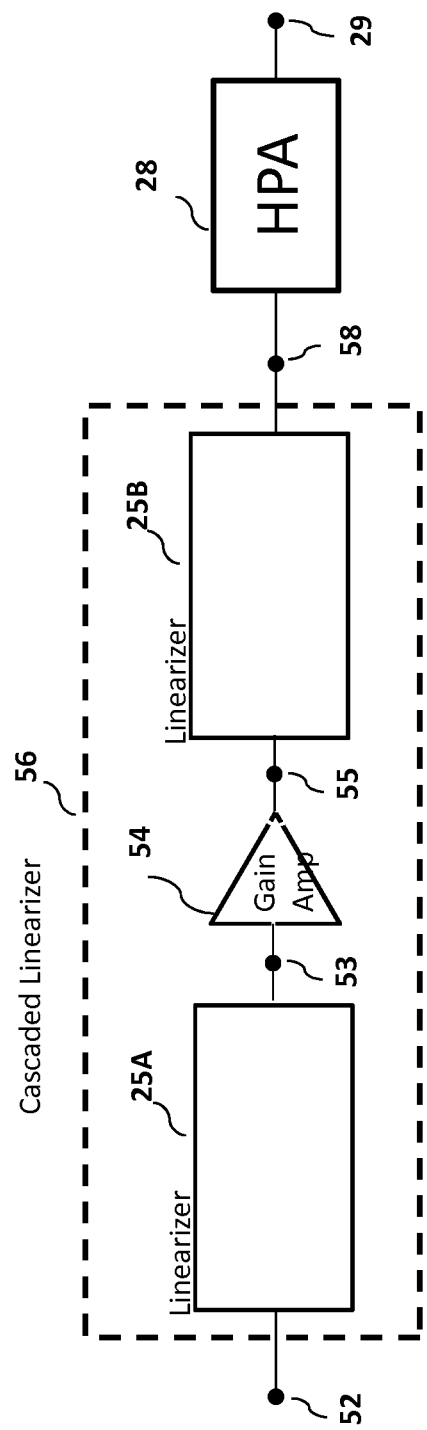
FIG. 17 shows a simplified block diagram of an amplifier system showing one embodiment of a cascaded linearizer operably connected to an HPA.

Two linearizers 25A, 25B could be cascaded in series to provide increased options of adjustability, as in the embodiment of a cascaded linearizer 56 shown in FIG. 17. Gain amplifier 54 serves the purpose of adding gain and adjusting the signal power level as appropriate to the linearizer 25B. An RF signal enters through terminal 52 and exits at terminal 58 to serve as a pre-distorted input signal for HPA 28. Such a cascaded arrangement could allow for higher values of gain and phase adjustment to be achieved than would otherwise be otherwise possible. In some embodiments, one of the linearizers 25A and 25B might be optimized to perform gain adjustment while the other independently and selectively performs phase adjustment. Many other variations are possible.

The above-described embodiments should be considered as examples of the present invention, rather than as limiting the scope of the invention. Different aspects of the present invention that are shown in different specific embodiments can be combined to provide other embodiments of the present invention. For example, various alternative types of transistors such as enhancement mode FETs or bipolar transistors could be used in different embodiments of the core circuit, as could other nonlinear devices with similar non-linear gain characteristics. Various modifications of the above-described embodiments of the present invention will become apparent to those skilled in the art from the foregoing description and accompanying drawings.

Accordingly, the present invention is to be limited solely by the scope of the following claims.

The invention claimed is:

1. An analog pre-distortion linearizer having predetermined gain and phase characteristics as a function of input RF signal power, said linearizer comprising:
a core circuit comprising:
an input terminal configured to receive an input RF signal;
an output terminal configured to provide a processed version of said input RF signal;
a transistor having a gate, a drain and a source, said gate being connected to said input terminal, and said drain being connected to said output terminal; and
a feedback circuit connected to said transistor, said feedback circuit being configured to present an impedance at the frequency of said input RF signal;
wherein a first dc bias voltage applied to said gate and a second dc bias voltage applied to said drain are selected to cause said transistor to operate at a quiescent bias point in a saturated region of the transistor I-V plane; and
wherein said quiescent bias point and said impedance are selected such that said linearizer has said predetermined gain and phase characteristics as a function of RF signal power.

2. The linearizer of claim 1, wherein said quiescent bias point is set such that the drain current of said transistor is below 5% of the Imax value of said transistor, and said second dc bias drain voltage of said transistor is below the $V_{br}$ breakdown voltage value of said transistor.

3. The linearizer of claim 2, wherein said quiescent point is selected such that said linearizer provides predominantly gain expansion for said input RF signal.

4. The linearizer of claim 2, wherein said impedance is capacitive.

5. The linearizer of claim 4, wherein said quiescent point is selected such that said linearizer provides predominantly phase expansion for said input RF signal.

6. The linearizer of claim 3, wherein said impedance is inductive.

7. The linearizer of claim 6, wherein said quiescent point is selected such that said linearizer provides predominantly phase compression for said input RF signal.

8. The linearizer of claim 2, wherein said feedback circuit is a parallel feedback circuit connected between said gate and said drain, said source of said transistor being directly connected to ground.

9. The linearizer of claim 2, wherein said feedback circuit is a series feedback circuit connected between said source of said transistor and ground.

10. A linearizer having predetermined gain and phase characteristics as a function of input RF signal power, said linearizer comprising:
a core circuit comprising:
an input terminal configured to receive an input RF signal;
an output terminal configured to provide a processed version of said input RF signal;
a transistor having a gate, a drain and a source, said gate being connected to said input terminal, and said drain being connected to said output terminal;
a parallel feedback circuit connected between said gate and said drain, said first feedback circuit being configured to present a first impedance at the frequency of said input RF signal; and
a series feedback circuit connected between said source of said transistor and ground, said second feedback circuit being configured to present a second impedance at the frequency of said input RF signal;
wherein a first dc bias voltage applied to said gate and a second dc bias voltage applied to said drain are selected to cause said transistor to operate at a quiescent point bias point in a saturated region of the transistor I-V plane; and wherein said quiescent bias point, said first impedance, and said second impedance are selected such that said linearizer has said predetermined gain and phase characteristics as a function of RF signal power.

11. The linearizer of claim 10, wherein said quiescent bias point is set such that the drain current of said transistor is below 5% of the Imax value of said transistor, and said second dc bias drain voltage of said transistor is below the $V_{br}$ breakdown voltage value of said transistor.

12. The linearizer of claim 11, wherein said quiescent point is selected such that said linearizer provides predominantly gain expansion for said input RF signal.

13. The linearizer of claim 11, wherein said first impedance is capacitive.

14. The linearizer of claim 13, wherein said quiescent point is selected such that said linearizer provides predominantly phase expansion for said input RF signal.

15. The linearizer of claim 11, wherein said first impedance is inductive.

16. The linearizer of claim 11, wherein said quiescent point is selected such that said linearizer provides predominantly phase compression for said input RF signal.

17. A method of generating a pre-distorted RF signal to compensate for expected gain and phase distortions characteristic of an amplifier, said method comprising:
  receiving an input RF signal at an input terminal of a core circuit comprising:
    a transistor having a gate, a drain and a source, said gate being connected to said input terminal, and said drain being connected to an output terminal configured to provide said pre-distorted RF signal; and
    a first feedback circuit connected to said transistor;
  applying a first dc bias voltage to said gate and applying a second dc bias voltage to said drain, selecting said first and second dc bias voltages to cause said transistor to operate at a quiescent bias point in a saturated region of the transistor I-V plane;
  tuning said first feedback circuit to present a first impedance at the frequency of said input RF signal, selecting said first impedance and said quiescent bias point such that if said pre-distorted RF signal is subsequently amplified by said amplifier to provide an output signal, said output signal is characterized by a lower value of at least one of gain distortion and phase distortion than the corresponding one of said expected gain distortion and phase distortion that would have occurred if said input RF signal had been input directly into said amplifier; and
  providing said pre-distorted RF signal at said output terminal.

18. The method of claim 17, further comprising setting said quiescent bias point such that the drain current of said transistor is below 5% of the Imax value of said transistor, and said second dc bias drain voltage of said transistor is below the $V_{br}$ breakdown voltage value of said transistor.

19. The method of claim 18, wherein said quiescent point is selected such that said pre-distortion imposed on said input RF signal by said method is predominantly gain expansion.

20. The method of claim 18, wherein said first impedance is capacitive, and wherein said first dc bias voltage and said second dc bias voltage are selected such that said pre-distortion imposed on said input RF signal by said method is predominantly phase expansion.

21. The method of claim 18, wherein said first impedance is inductive, and wherein said quiescent point is selected such that said pre-distortion imposed on said input RF signal by said method is predominantly phase compression.

22. The method of claim 17, wherein said core circuit additionally comprises a second feedback circuit connected to said transistor, said method further comprising tuning said second feedback circuit to present a second impedance at the frequency of said input RF signal.

* * * * *